United States Patent [19]
Pradeep et al.

[11] Patent Number: 5,866,448
[45] Date of Patent: Feb. 2, 1999

[54] PROCEDURE FOR FORMING A LIGHTLY-DOPED-DRAIN STRUCTURE USING POLYMER LAYER

[75] Inventors: Yelehanka Ramachandramurthy Pradeep; Tang Kok Hiang; Mei Sheng Zhou, all of Singapore, Singapore

[73] Assignee: Chartered Semiconductor Manufacturing Ltd., Singapore, Singapore

[21] Appl. No.: 902,757

[22] Filed: Jul. 30, 1997

[51] Int. Cl.[6] .................... H01L 21/8238; H01L 21/336
[52] U.S. Cl. .................. 438/231; 438/303; 438/305; 438/963
[58] Field of Search .................. 438/305, 592, 438/595, 963, 231, 303

[56] References Cited

U.S. PATENT DOCUMENTS

| | | | |
|---|---|---|---|
| 4,975,385 | 12/1990 | Beinglass et al. | 437/44 |
| 5,188,980 | 2/1993 | Lai . | |
| 5,368,686 | 11/1994 | Tatsumi et al. . | |
| 5,451,291 | 9/1995 | Park et al. | 156/644 |
| 5,468,665 | 11/1995 | Lee et al. . | |
| 5,472,890 | 12/1995 | Oda . | |
| 5,518,970 | 5/1996 | Hoda et al. | 437/41 |
| 5,563,098 | 10/1996 | Kuo et al. . | |
| 5,656,523 | 8/1997 | Wilhoit | 438/303 |
| 5,698,072 | 12/1997 | Fukuda . | |
| 5,753,557 | 5/1998 | Tseng | 438/303 |

OTHER PUBLICATIONS

S. Wolf, "Silicon Processing For The VLSI Era—vol. 12" Lattice Press, Sunset Beach, CA, 1990, p. 348.

*Primary Examiner*—Richard A. Booth
*Attorney, Agent, or Firm*—George O. Saile; Stephen B. Ackerman

[57] ABSTRACT

A method for fabrication of a lightly-doped-drain (LDD) structure for self aligned polysilicon gate MOSFETs is described wherein a polymer layer, formed along the sidewall during the patterning process of the polysilicon gate electrode, is used to mask the source/drain ion implant. The sidewall polymer layer replaces the conventional silicon oxide sidewall as an LDD spacer and offers improved thickness control as well as an improved sequence of processing steps whereby the deposition of a spacer oxide layer onto the gate oxide is eliminated. A cap oxide layer first deposited over the gate polysilicon layer. This oxide layer is then patterned and etched using RIE under conditions which form a polymer sidewall layer along the edges of the cap oxide pattern. The polysilicon layer is then etched, and has a pattern concentric with the cap oxide pattern but wider by the thickness of the polymer sidewall. After removal of the polymer and residual photoresist, the source/drain implant is performed, followed by removal of the polysilicon lip by RIE using the cap oxide as a mask. The LDD implant is then performed.

29 Claims, 6 Drawing Sheets

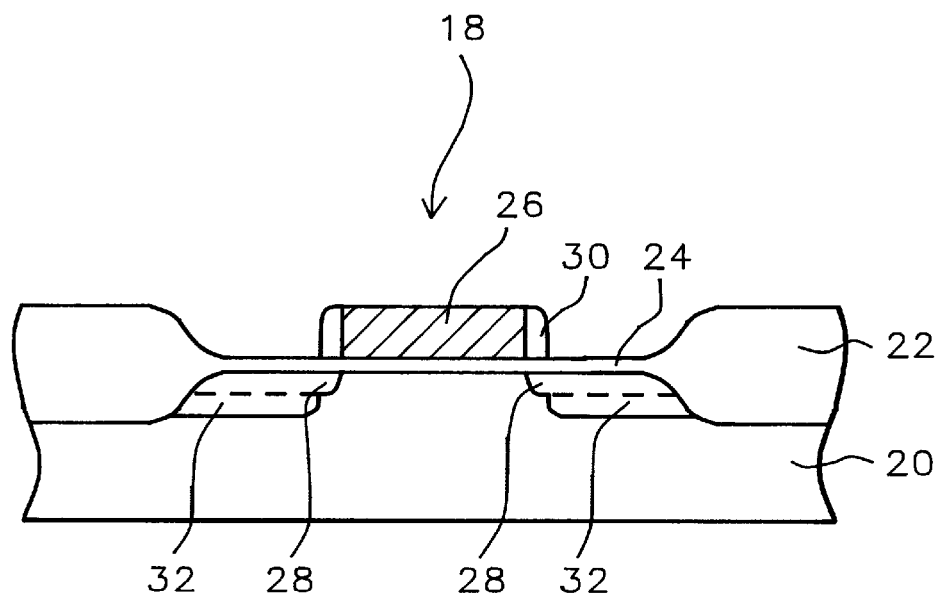
FIG. 1 – Prior Art
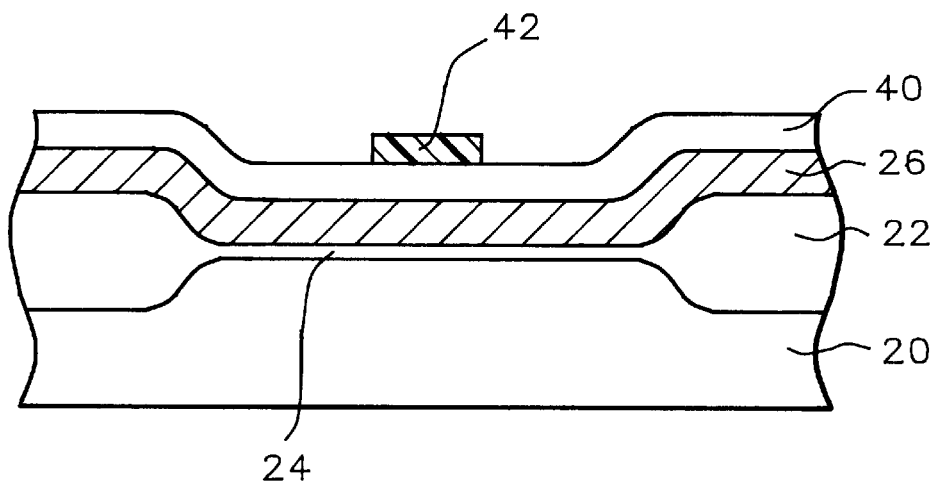
FIG. 2

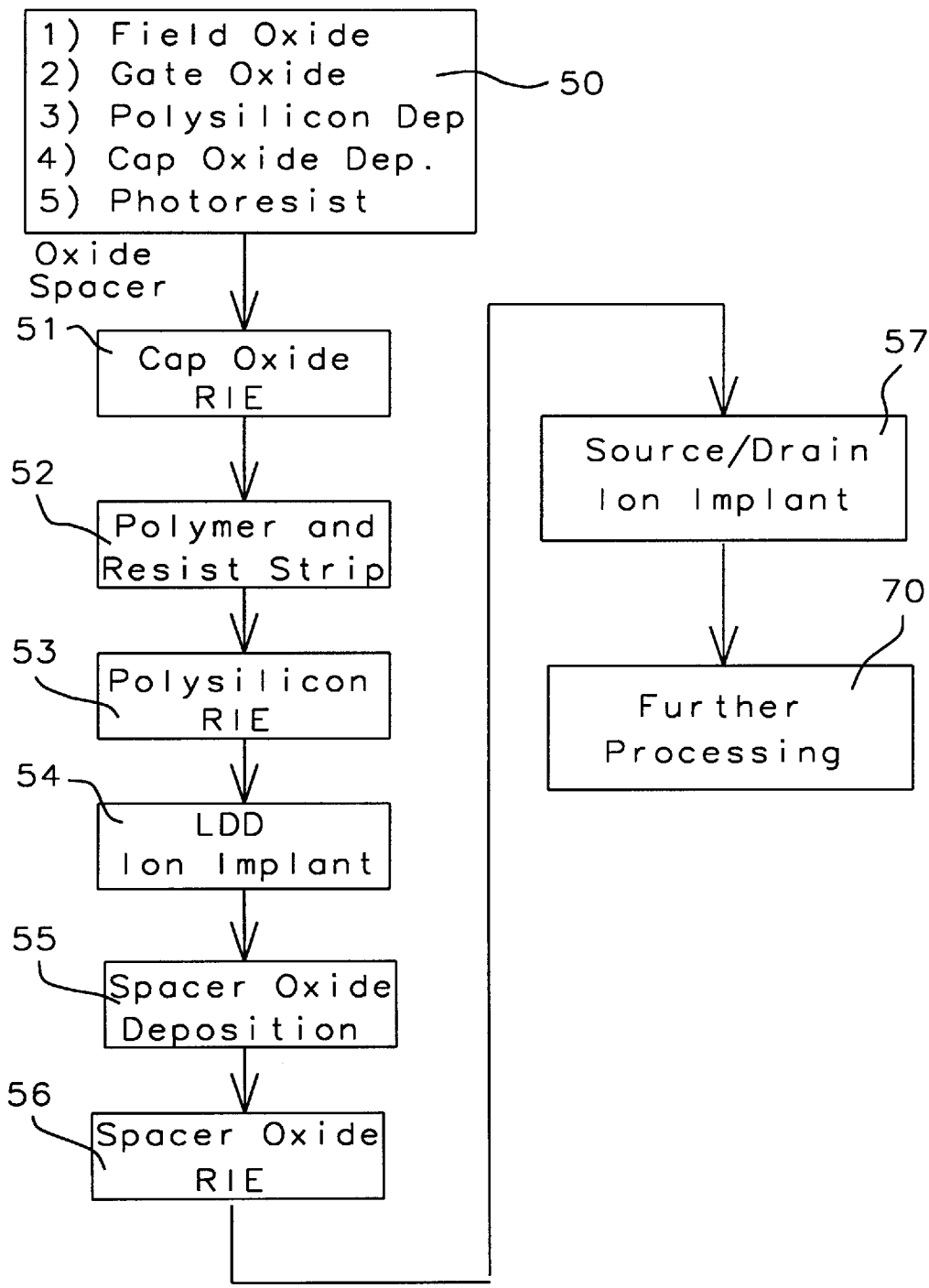
FIG. 8a – Prior Art

PROCEDURE FOR FORMING A LIGHTLY-DOPED-DRAIN STRUCTURE USING POLYMER LAYER

BACKGROUND OF THE INVENTION (1). Field of the Invention

The invention relates to processes for the manufacture of semiconductor devices and more particularly to processes for forming self-aligned-polysilicon-gate field effect transistors with lightly doped drains.

(2). Description of Prior Art

It has been determined that hot carrier effects will cause unacceptable performance degradation in n-channel MOS field effect transistors(MOSFETs) built with singly diffused drain structures if their channel length is below about 2 microns. This degradation is due primarily to high electric fields occurring in the drain region which cause the formation of hole-electron pairs by impact ionization. To overcome this problem the lightly-doped-drain (LDD) structure is widely used. A discussion of hot carriers and the formation of the LDD structure may be found in Wolf, S., "Silicon Processing for the VLSI Era", Vol. 2, Lattice Press, Sunset Beach, Calif., (1990), p 348ff. FIG. 1 shows a cross section of the LDD structure. The MOSFET 18 is formed on wafer 20 by first forming a field oxide 22 which surrounds the device. The silicon oxide gate insulator 24 is then grown by thermal oxidation of the silicon surface and a gate electrode 26, usually of doped polysilicon is defined by photolithographic techniques. Using the gate electrode as a mask, an ion-implantation forms the lightly-doped region 28 aligned to the gate electrode. A layer of insulative material, typically silicon oxide, is next deposited by low-pressure-chemical-vapor-deposition (LPCVD). This layer is then etched by a unidirectional technique, typically reactive-ion-etching (RIE) whereby silicon oxide sidewalls 30 are formed along the edges of the polysilicon gate electrode. The width of the sidewalls 30 corresponds roughly to the original thickness of the insulative layer. A second ion-implant is then performed at a higher dose to form the main portions 32 of the source/drain regions of the device. Both implantation are perfectly self-aligned to the gate electrode an require no photolithographic steps. By having reduced doping in the region 28 immediately at the edge of the channel region, the doping gradient is less abrupt. This results in a lower electric field and consequently a reduction of hot carrier generation.

A function of the oxide sidewall 30 is to provide spacing around the gate electrode to locate the source/drain implant away from the edge of the gate. After the implant is completed, an inter level dielectric (ILD) layer is deposited over the structure and contact openings are made to access the elements of the MOSFET. The oxide sidewall 30 becomes part of that ILD layer.

Although the just described method for forming the LDD structure using a silicon oxide sidewall is the most commonly used and easiest understood, other variations have been purported wherein the sidewall is fashioned of different materials. Hodate et. al. U.S. Pat. No. 5,518,940 forms the sidewall spacer of photoresist. The photoresist is selectively electro-deposited on the top and sides of the polysilicon gate electrode by application of a voltage to the electrode while the substrate wafer is submersed in an electrolyte. The application is the manufacture of liquid crystal displays. Such electro-deposition procedures are not compatible with current integrated circuit manufacturing processes.

Hodate points out several disadvantages of the oxide sidewall formation process. One is the non-uniformity of RIE plasma over large substrate areas. Another is a dependence of the sidewall thickness on the thickness of the polysilicon gate electrode.

Beinglass U.S. Pat. No. 4,975,385 describes a method of forming an LDD structure by using spacers of polysilicon which are selectively deposited on the edges of the polysilicon gate electrode after the LDD implantation. Only the edges (sidewalls) of the polysilicon gates are exposed during this deposition and a specified LPCVD process is used to deposit only on these exposed sidewalls. After the deposition the second high dosage source/drain implantation is made. The polysilicon sidewalls are not subsequently removed and become part of the structure. They therefore are prone to participate as part of the gate electrode affecting the resultant channel.

Reactive ion etching of patterns in insulative layers such as silicon oxide with halocarbon gases is typically accompanied by the formation of polymer deposits along the walls of the openings. It is also widely believed that the ability to achieve anisotropic etching of these materials in chloro-fluorocarbon gas mixtures is the direct result of the formation of these polymers. The polymer layer protects the sidewalls from chemical reaction while the etch front is kept clear of the polymer by ion bombardment. Unidirectional etching is thereby accomplished.

When pattern etching is completed steps are taken to remove the polymeric deposits before proceeding, usually by wet chemical dissolution. The task of removing both polymer and residual photoresist is accomplished by a combination of oxygen plasma ashing and the use of stripper solutions. Park et. al. U.S. Pat. No. 5,451,291 discusses the formation of via openings over aluminum using such combinations.

The growth of polymer along the sidewalls of the opening being etched can be well controlled both by the selection of etchant gases as well as adjustment of the RIE parameters. Thus the final thickness of the polymer deposit on the sidewall can also be pre-determined.

SUMMARY OF THE INVENTION

It is an object of this invention to describe a method for forming an LDD structure using a polymer sidewall on the polysilicon gate electrode.

It is another object of this invention to provide a method for forming a self-aligned polysilicon gate MOSFET having an LDD structure formed using polymer sidewalls along the polysilicon gate electrode.

It is yet another object of this to provide a method whereby both the LDD regions and the more heavily doped source/drain regions may be accomplished with a single ion implantation step.

It is yet another object of this invention to provide a method of forming complimentary MOSFET devices on a silicon wafer having LDD structures formed by using polymer sidewalls along the polysilicon gate electrode.

It is yet another object of this invention to provide a method of forming MOSFET devices having a reduced gate to source/drain capacitance.

These objects are accomplished by forming a cap oxide layer over the a deposited polysilicon layer, patterning said cap oxide with photoresist, and then etching said cap oxide layer using RIE with a chemistry and parameters to not only provide selectivity of oxide over photoresist and polysilicon but also grow a pre-selected thickness of polymer along the vertically etched walls of the cap oxide.

When the etching process has reached the cap oxide-polysilicon interface, an over-etch period is engaged wherein polymer is allowed to reach its final thickness at the base of the cap oxide opening. Next the chemistry and etching parameters are changed and the subjacent polysilicon layer is etched. The pattern formed in the polysilicon layer is concentric with that of the cap oxide pattern with the polysilicon extending laterally in all directions beyond the cap oxide pattern by the thickness of the polymer sidewall.

Polymer and residual photoresist are then stripped and a source/drain ion implant is performed. In one embodiment of this invention the source/drain implant is performed using the extended polysilicon lip to totally block ion penetration in the LDD region. Next the polysilicon lip is removed by RIE using the cap oxide as a hardmask. The LDD ion implant is made. Conventional processing proceeding with the deposition of an inter-level-dielectric (ILD) layer, is then used to complete the device.

In another embodiment of this invention both the LDD regions and the more heavily doped source/drain regions may be accomplished with a single ion implantation step. This is accomplished by appropriate selection of implant energy and dose according to the polysilicon gate thickness. The implantation is performed after the polymer sidewall has been stripped. The extensions of the polysilicon gate beyond the edges of the cap oxide provide limited masking capability, thereby allowing a reduced ion penetration into the intended LDD regions. The cap oxide provides sufficient masking capability to prevent ion penetration into the channel region.

Although the number and types of processing steps for the polymer sidewall LDD formation are comparable to those of the silicon oxide method, a notable advantage of the polymer sidewall method is that the sidewall oxide deposition onto the silicon active area is eliminated, thereby reducing the risk of channel contamination. A processing step is eliminated in the embodiment where a single implant is used for both source/drain and LDD.

BRIEF DESCRIPTION OF THE DRAWINGS

FIG. 1 is a cross section of a self-aligned polysilicon gate MOSFET having an LDD structure formed by a prior art process using a silicon oxide sidewall.

FIG. 2 through FIG. 6 are cross sections of a self-aligned polysilicon gate MOSFET at various stages during the formation of an LDD structure according to a first embodiment of this invention.

FIGS. 8(A) and 8(B) are flow charts showing the sequence of processing steps for the formation of an integrated circuit containing MOSFETs with an LDD structure. The chart shows a comparison of the process steps of a prior art method and those of the present invention.

DESCRIPTION OF THE PREFERRED EMBODIMENTS

Figure 3:
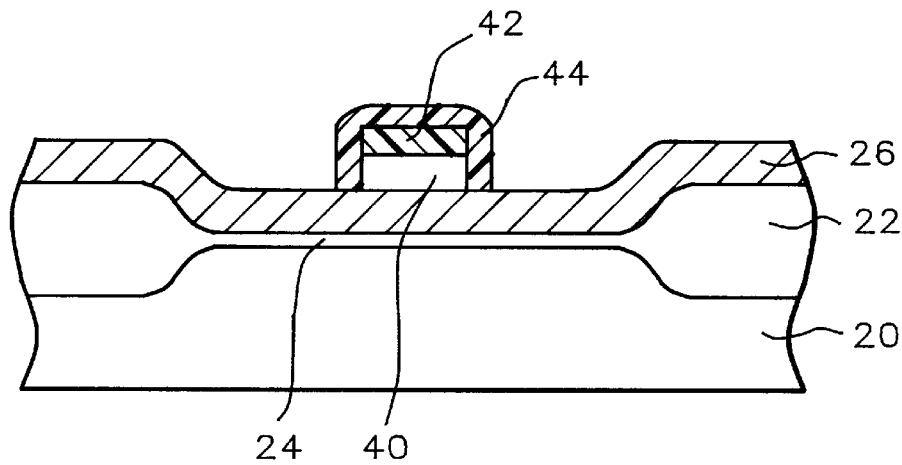

In a first embodiment of this invention a p-type monocrystalline silicon wafer substrate is provided. Referring to FIG. 2, the wafer 20 is processed using well known procedures, to the point where active regions for the formation of self-aligned polysilicon gate MOSFET transistors have been isolated by a field oxide 22, a gate oxide 24 has been grown, and a layer of polysilicon 26 has been deposited to form the polysilicon gate electrodes. The next step in the conventional process would be the patterning of the polysilicon layer 24 to form the gate electrode structure. However, in this embodiment, a layer of silicon oxide 40 is deposited over the polysilicon layer. The silicon oxide layer 40 is deposited to a thickness of between about 1,000 and 3,000 Angstroms using well know LPCVD procedures. Photoresist 42 is deposited over the silicon oxide layer and patterned to define the polysilicon gate electrodes. The wafer is then placed into an RIE tool, such as a cluster tool, wherein both the silicon oxide layer (cap oxide) 40 and the polysilicon layer 26 are etched sequentially during a single pumpdown operation. Etchant gases and parameters are changed during the operation to accommodate both layers. Alternately, the cap oxide 40 and the polysilicon layer 26 may be etched is separate tools wherein one tool is dedicated to oxide etching and the other to silicon etching.

Referring next to FIG. 3, the silicon oxide layer 40 is first etched using a gas mixture comprising about 8 to 12 SCCM $CHF_3$, 25 to 35 SCCM $CF_4$, and about 750 to 850 SCCM Argon, etc.). During the oxide etching process, a polymer 44 is deposited over the exposed sidewalls of the oxide pattern 40. The gases chosen in these proportions permit a sidewall polymer build up of between about 800 and 1,000 Angstroms at the completion of the cap oxide etching process. The initial thickness of the cap oxide layer and the etchant gas composition are chosen to provide a polymer growth rate such that the desired thickness of polymer is achieved at the termination of the cap oxide over-etch.

During the cap oxide RIE, polymer builds up along the sidewalls. The etching process is observed using optical emission spectroscopy. A fall of in the magnitude of the CO signal indicates that endpoint has been reached. An additional period of over-etch is allowed to build up sufficient polymer at the base of the sidewall. The etch rate ratio of silicon oxide to polysilicon is about 20 to 1 so that a negligible amount of the polysilicon is removed during this overetch.

Figure 4:
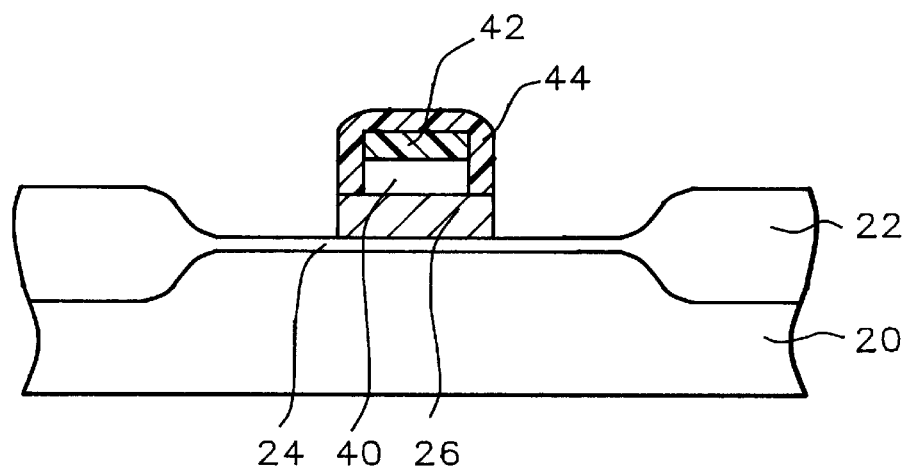

After the polymer deposition is completed the polysilicon is etched, either in the same tool or in a separate RIE tool. The etchant gas used in this embodiment contains $Cl_2$, HBr, $H_2$, and $O_2$, although other etchant compositions may also be used. The etch mask for the polysilicon RIE comprises the cap oxide extended by the sidewall polymer as is shown in FIG. 4. Polymer buildup does not occur during this step. The wafer is then removed from the RIE tool and the residual photoresist is removed by oxygen ashing and the polymer is stripped by well known wet strippers.

Figure 5:
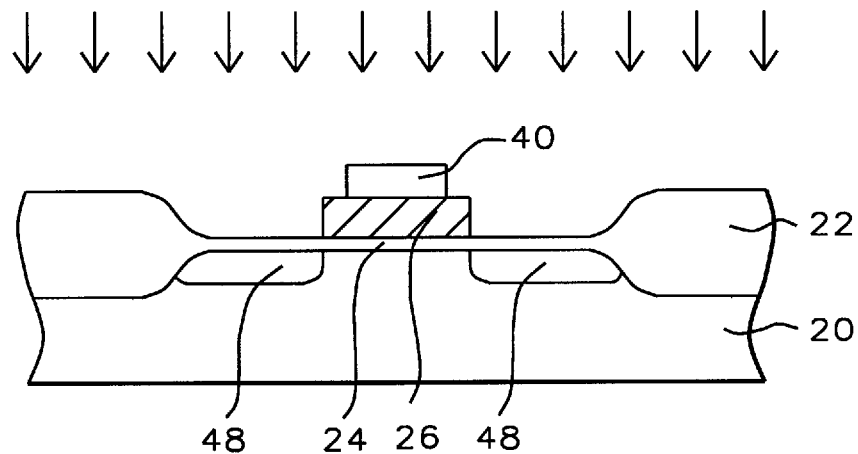

FIG. 5 shows the structure after the stripping operation. The wafer is implanted with arsenic or phosphorous at a dosage and energies established and well known for MOSFETS to form the main body of the source/drain active areas. The spacing is determined by the polysilicon mask 26.

Figure 6:
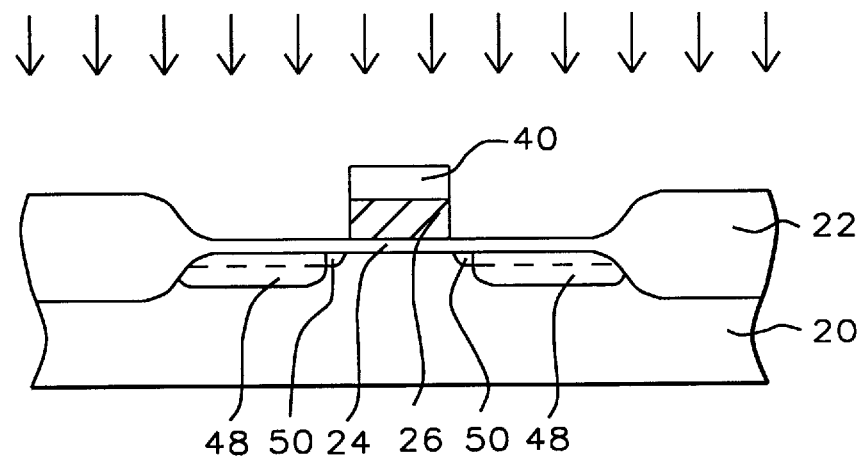

Next, using the cap oxide as a hardmask, the lip around the polysilicon is removed by RIE thereby removing the lip and reducing the polysilicon gate electrode to its design size as shown in FIG. 6. The implanted source/drain regions are now spaced away from under the edge of the gate electrode. Next an ion implant of an n-type dopant forms the LDD transition from the source/drain to the channel region located under the gate electrode 26.

In a second embodiment of this invention both the LDD regions and the more heavily doped source/drain regions are formed with a single ion implantation step. This is accomplished by appropriate selection of implant energy and dose according to the polysilicon gate thickness. As in the first embodiment the wafer is processed to the point wherein the cap oxide is etched and over-etched to form the polymer sidewall as shown in FIG. 4. The photoresist and polymer are then stripped as in the first embodiment.

Figure 7:
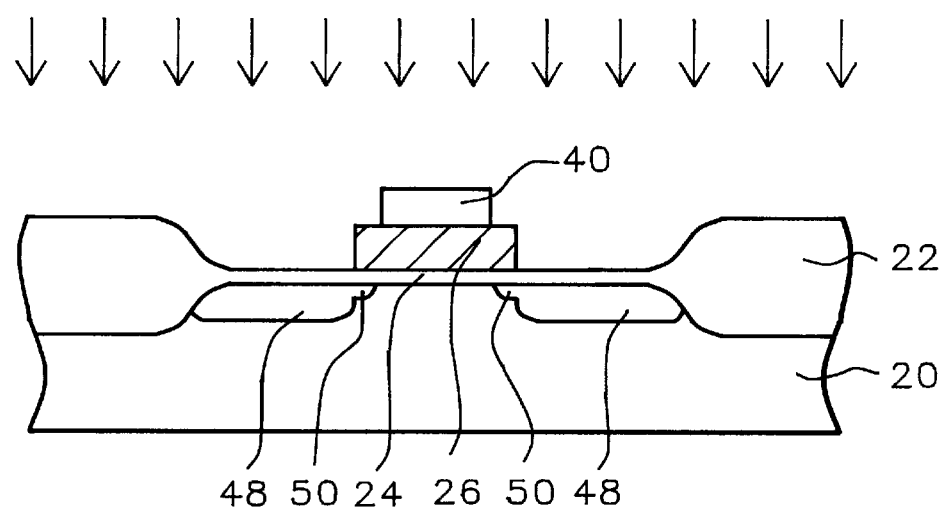
FIG. 7 is a cross section illustrating a portion of the process of a second embodiment of this invention.

An ion implant is then performed using the cap oxide and the polysilicon lip as the implantation mask. For the n-channel device either phosphorous or arsenic is implanted. The dosage and the implant energy are chosen such that the polysilicon lip curtails ion penetration into the substrate silicon sufficiently to provide the proper LDD ion concentration beneath it. At the same time the heavier and deeper dosage is applied in the source/drain regions. The single ion implantation on step is illustrated by the cross section shown in FIG. 7. The thickness of the polysilicon is a determining factor in the choice of implant energies and dosages. The penetration range of various dopants into silicon and silicon oxide are well known and have been extensively published.

An additional option to further control the profile of the LDD implant under the polysilicon lip may be realized by using large angle tilt (LAT) ion implantation. The extensions of the polysilicon gate beyond the edges of the cap oxide provide limited masking capability. Their shape and thickness as well as the angle of the implant determine the concentration profile of dopant in the LDD region. The cap oxide provides sufficient masking capability to prevent ion penetration into the channel region.

While the first embodiment of this invention utilized a p-type silicon substrate, thereby forming an n-channel MOSFET, an n-type silicon substrate could also be used to form a p-channel MOSFET without departing from the concepts therein provided.

It should be further understood that the substrate conductivity type as referred to herein does not necessarily refer to the conductivity of the starting wafer but could also be the conductivity of a diffused region or well within a wafer wherein the semiconductor devices are incorporated.

In the manufacture of complimentary MOSFETs (CMOS) both n-channel and p-channel devices are formed on the same wafer. Additional masking steps are required during the ion implantations to protect one type of device while the other is implanted. For example, during the source drain implantation of the p-channel devices, the n-channel devices are covered by a photoresist block-out mask. Afterwards the photoresist is stripped and the p-channel devices are covered with a photoresist block-out mask and the n-channel devices are exposed to implantation. The same procedure is then repeated for the LDD implantation.

Figure 8B:
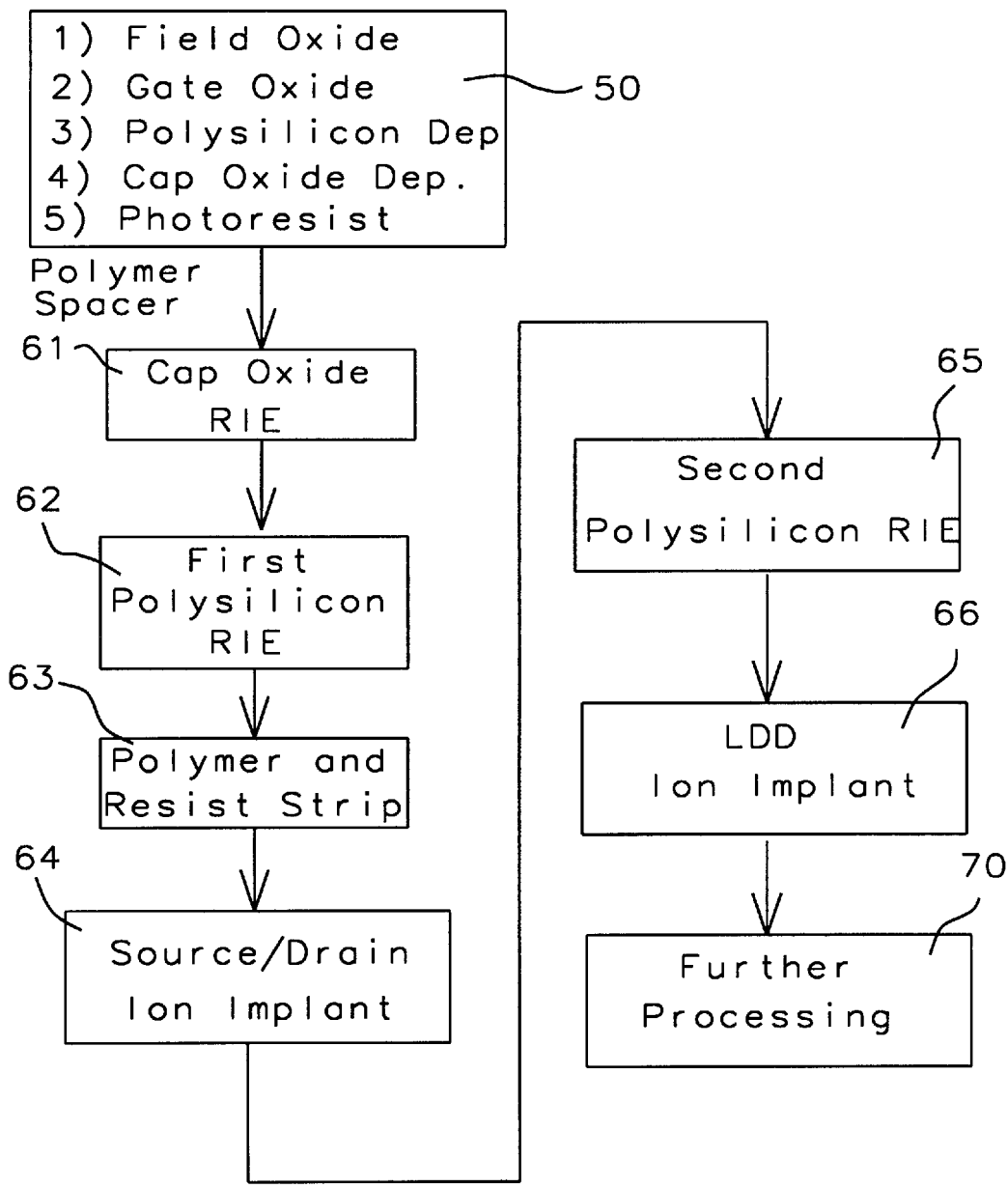

The flow charts shown in FIGS. 8a/8b provide a comparison of a conventional process for forming an LDD structure using a silicon oxide spacer (FIG. 8a) with the process of this invention using a polymer spacer (FIG. 8b). In a CMOS process the dual implantation steps for the n- and p-channel MOSFETs are implied in each implantation operation.

The steps included in 50 comprise the initial steps which are common to both processes. These include the formation of the field oxide regions, the growth of the gate oxide, the deposition of the polysilicon layer from which the gate electrodes are to be formed, the deposition of the cap oxide and the photolithography step which defines cap oxide and subsequently the polysilicon gate electrode. The polysilicon layer may be of a composite form, having both doped and undoped portions.

Six analogous operations are shown for each process. Each process has two ion implantations, three RIE operations, and one polymer and resist strip. However, their sequence in each process are different. The oxide spacer process has an additional deposition operation 55, that of the oxide spacer.

In the polymer sidewall process, the first two RIE operation 61 and 62 may be performed sequentially within the same tool although it is not necessary. For the CMOS process, the source/drain and LDD implant processes each involve the alternate masking of PMOS devices while NMOS devices are implanted and masking of NMOS devices while the PMOS devices are implanted. In the oxide spacer process the LDD implantation 54 occurs before the source/drain implantation 57, while in the polymer sidewall process the source/drain implant 64 occurs before the LDD implant 66. After the final implantation in each process the wafer is returned to the conventional processing sequence 70.

Besides the elimination of a process operation, and the option of performing two operations in a single tool, the polymer sidewall process has the added benefit of providing a reduction in source/drain capacitance.

While this invention has been particularly shown and described with reference to the preferred embodiments thereof, it will be understood by those skilled in the art that various changes in form and details may be made without departing from the spirit and scope of the invention.

What is claimed is:

1. A method for forming a self-aligned polysilicon gate MOSFET with a LDD structure comprising:
    (a) providing a silicon wafer having an active region, a field isolation region surrounding said active region, and a gate insulator over said active region;
    (b) depositing a polysilicon layer over said gate insulator;
    (c) depositing an insulative layer over said polysilicon layer;
    (d) depositing a photoresist layer over said insulative layer;
    (e) patterning said photoresist layer to define a gate electrode;
    (f) etching said insulative layer with an unidirectional etching technique using said patterned photoresist as a mask whereby vertical sidewalls are formed in said insulative layer and a polymer layer is deposited over said sidewalls, which shields a first portion of said polysilicon layer;
    (g) etching a second portion of said polysilicon layer using said polymer layer as a mask;
    (h) stripping said polymer layer and said photoresist layer;
    (i) implanting a first dose of dopant atoms into said active region;
    (j) etching said first portion of said polysilicon layer; and
    (k) implanting a second dose of dopant atoms into said active region.

2. The method of claim 1 wherein said polysilicon layer is between 1,000 and 3,700 Angstroms thick.

3. The method of claim 1 wherein said insulative layer is silicon oxide and is between about 1,000 and 3,500 Angstroms thick.

4. The method of claim 1 wherein said unidirectional etching technique for etching said insulative layer is reactive-ion-etching using $CF_4$, $CHF_3$, and Ar.

5. The method of claim 4 wherein the $CF_4$ is flowed at a rate between about 8 and 12 SCCM, the $CHF_3$ at a rate between about 25 and 35 SCCM, and the Ar at a rate between about 750 and 850 SCCM.

6. The method of claim 1 wherein said second portion of said polysilicon layer is etched by reactive-ion-etching using $Cl_2$, HBr, $O_2$ and Ar.

7. The method of claim 1 wherein said insulative layer and said second portion of said polysilicon layer are etched sequentially in a single pumpdown operation of an RIE tool.

8. The method of claim 1 wherein an over-etch period is provided after etching said insulative layer whereby additional polymer is formed over said sidewalls.

9. The method of claim 8 wherein said over etch period is selected to provide a polymer buildup of between about 800 and 1,000 Angstroms over said sidewalls.

10. The method of claim 1 wherein said active region is p-type.

11. The method of claim 10 wherein the first dose of dopant atoms is between about $2\times10^{15}$ and $6\times10^{15}$ atoms/$cm^2$ of phosphorous implanted at an energy of between about 40 and 60 keV.

12. The method of claim 10 wherein the second dose of dopant atoms is between about $1\times10^{15}$ and $5\times10^{15}$ atoms/$cm^2$ of Arsenic implanted at an energy of between about 20 and 40 keV.

13. A method of forming a CMOS integrated circuit having self-aligned polysilicon gate MOSFETs with an LDD structure comprising:

(a) providing a silicon wafer having a plurality of n- and p-type active regions, a field isolation region surrounding each active region, and a gate insulator over each active region;

(b) depositing a polysilicon layer over said gate insulator;

(c) depositing a first insulative layer over said polysilicon layer;

(d) depositing a first photoresist layer over said insulative layer;

(e) patterning said first photoresist layer to define gate electrodes;

(f) etching said first insulative layer with an unidirectional etching technique using said patterned photoresist as a mask whereby vertical sidewalls are formed in said insulative layer and a polymer layer is deposited over said vertical sidewalls;

(g) etching a first portion of said polysilicon layer thereby exposing a portion of said gate insulator not covered by said polymer layer and said polysilicon layer and forming a polysilicon lip extending beyond the periphery of said insulative layer by a distance corresponding to the thickness of said polymer layer;

(h) stripping said polymer layer and said photoresist layer thereby exposing said polysilicon lip and said sidewalls;

(i) depositing and patterning a second photoresist layer to expose active regions of a first conductivity type while protecting active regions of a second conductivity type;

(j) implanting a first dose of dopant atoms into said active regions of said first conductivity type;

(k) stripping said second photoresist layer;

(l) depositing and patterning a third photoresist layer to expose active regions of said second conductivity type while protecting active regions of said first conductivity type;

(m) implanting a second dose of dopant atoms into said active regions of said second conductivity type;

(n) stripping said third photoresist layer;

(o) etching a second portion of said polysilicon layer, thereby removing said polysilicon lip;

(p) depositing and patterning a fourth photoresist layer to expose active regions of said first conductivity type while protecting active regions of said second conductivity type;

(q) implanting a third dose of dopant atoms into said active regions of said first conductivity type;

(r) stripping said fourth photoresist layer;

(s) depositing and patterning a fifth photoresist layer to expose active regions of said second conductivity type while protecting active regions of said first conductivity type;

(t) implanting a fourth dose of dopant atoms into said active regions of said second conductivity type thereby completing the formation of said MOSFETs of said CMOS integrated circuit;

(u) stripping said fifth photoresist layer;

(v) depositing a second insulative layer;

(w) patterning and etching said second insulative layer to form access openings to active elements of said MOSFETs; and (x) forming a wiring network over said second insulative layer which interconnects said MOSFETs thereby completing said CMOS integrated circuit.

14. The method of claim 13 wherein said polysilicon layer is between 1,000 and 3,700 Angstroms thick.

15. The method of claim 13 wherein said first insulative layer is silicon oxide and is between about 1,000 and 3,500 Angstroms thick.

16. The method of claim 13 wherein said unidirectional etching technique for etching said first insulative layer is reactive-ion-etching using $CF_4$, $CHF_3$, and Ar.

17. The method of claim 16 wherein the $CF_4$ is flowed at a rate between about 8 and 12 SCCM, the $CHF_3$ at a rate between about 25 and 35 SCCM, and the Ar at a rate between about 750 and 850 SCCM.

18. The method of claim 13 wherein said first portion of said polysilicon layer and said polysilicon lip are etched by reactive-ion-etching using $Cl_2$, HBr, Ar, and $O_2$.

19. The method of claim 13 wherein said first insulative layer and said first portion of said polysilicon layer are etched sequentially in a single pumpdown operation of an RIE tool.

20. The method of claim 13 wherein an over-etch period is provided after etching of said first insulative layer whereby additional polymer is formed.

21. The method of claim 20 wherein said over etch period is selected to provide a polymer buildup of between about 800 and 1,000 Angstroms over said sidewalls.

22. A method for forming a self-aligned polysilicon gate MOSFET with an LDD structure comprising:

(a) providing a silicon wafer having an active region, a field isolation region surrounding said active region, and a gate insulator over said active region;

(b) depositing a polysilicon layer over said gate insulator;

(c) depositing an insulative layer over said polysilicon layer;

(d) depositing a photoresist layer over said insulative layer;

(e) patterning said photoresist layer to define a gate electrode;

(f) etching said insulative layer with an unidirectional etching technique using said patterned photoresist as a mask whereby vertical sidewalls are formed in said insulative layer and a polymer layer is deposited over said sidewalls;

(g) etching a first portion of said polysilicon layer thereby exposing a portion of said gate insulator not covered by said polymer layer and said polysilicon layer and forming a polysilicon lip extending beyond the periphery of said insulative layer by a distance corresponding to the thickness of said polymer layer;

(h) stripping said polymer layer and said photoresist layer thereby exposing said polysilicon lip and said sidewalls;

(i) implanting a dose of dopant atoms whereby a source/drain region is formed in said active region beneath said portion of said gate insulator and an LDD region is formed beneath said polysilicon lip by penetration of dopant atoms through said polysilicon lip; and (j) etching said polysilicon lip.

23. The method of claim 22 wherein said polysilicon layer is between 1,000 and 3,700 Angstroms thick.

24. The method of claim 22 wherein said insulative layer is silicon oxide and is between about 1,000 and 3,500 Angstroms thick.

25. The method of claim 22 wherein said unidirectional etching technique for etching said insulative layer is reactive-ion-etching using $CF_4$, $CHF_3$, and Ar.

26. The method of claim 25 wherein the $CF_4$ is flowed at a rate between about 8 and 12 SCCM, the $CHF_3$ at a rate between about 25 and 35 SCCM, and the Ar at a rate between about 750 and 850 SCCM.

27. The method of claim 22 wherein said first portion of said polysilicon layer and said polysilicon lip are etched by reactive-ion-etching using $Cl_2$, HBr, $O_2$ and Ar.

28. The method of claim 22 wherein an over-etch period is provided after etching of said insulative layer whereby additional polymer is formed.

29. The method of claim 28 wherein said over etch period is selected to provide a polymer buildup of between about 800 and 1,000 Angstroms over said sidewalls.

* * * * *